(12) United States Patent
Tramet et al.

(10) Patent No.: US 10,141,666 B2
(45) Date of Patent: Nov. 27, 2018

(54) SUPPORT OF AN ELECTRONIC UNIT, ELECTRICAL DEVICE COMPRISING SAME AND ELECTRIC MACHINE COMPRISING THE SAID ELECTRICAL DEVICE

(71) Applicant: Valeo Systemes de Controle Moteur, Cergy, Pontoise (FR)

(72) Inventors: Guillaume Tramet, Montesson (FR); Arnaud Mas, Cergy (FR); Ernesto Sacco, Cergy (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 0 days.

(21) Appl. No.: 15/364,349

(22) Filed: Nov. 30, 2016

(65) Prior Publication Data
US 2017/0162957 A1    Jun. 8, 2017

(30) Foreign Application Priority Data

Dec. 2, 2015    (FR) ...................................... 15 61736

(51) Int. Cl.
| | |
|---|---|
| *H01R 12/00* | (2006.01) |
| *H01R 12/52* | (2011.01) |
| *H05K 7/14* | (2006.01) |
| *H05K 3/28* | (2006.01) |

(52) U.S. Cl.
CPC .......... *H01R 12/52* (2013.01); *H05K 7/1432* (2013.01); *H05K 3/284* (2013.01)

(58) Field of Classification Search
CPC .. H05K 7/026; H01R 2103/00; H01R 13/514; H01R 9/2408

USPC ................................ 439/76.2, 695, 701, 717
See application file for complete search history.

(56) References Cited

U.S. PATENT DOCUMENTS

| | | | | |
|---|---|---|---|---|
| 6,152,758 | A * | 11/2000 | Matsuoka .......... | H01R 13/6215 439/247 |
| 6,690,582 | B2 * | 2/2004 | Sumida ............... | B60R 16/0238 361/735 |
| 6,922,332 | B2 * | 7/2005 | Naimi ................. | B60R 16/0238 361/641 |

(Continued)

FOREIGN PATENT DOCUMENTS

| | | |
|---|---|---|
| FR | 2932022 A1 | 12/2009 |
| FR | 3014257 A1 | 6/2015 |
| FR | 3020727 A1 | 11/2015 |

OTHER PUBLICATIONS

Preliminary Search Report issued in corresponding French Patent Application No. 1561736, dated Oct. 24, 2016 (2 pages).

*Primary Examiner* — Thanh Tam Le
(74) *Attorney, Agent, or Firm* — Osha Liang LLP

(57) ABSTRACT

A support of an electronic unit, configured to be integrated into a housing to support a first electronic unit and to allow electrical connection between the first electronic unit and a second electronic unit situated opposite, via at least one electrical connection element. The support includes: an open cavity for receiving the first electronic unit; a hollow column into which the at least one electrical connection element is inserted, the hollow column extending from the open cavity and being configured to communicate with the open cavity at a first end of the hollow column; and a channel including an end communicating with the bottom of the open cavity and another end communicating with a lateral wall of the hollow column.

9 Claims, 2 Drawing Sheets

(56) References Cited

U.S. PATENT DOCUMENTS

| | | | | |
|---|---|---|---|---|
| 7,594,830 B2* | 9/2009 | Murakami | ............ | H01R 4/185 |
| | | | | 439/701 |
| 7,727,022 B2* | 6/2010 | Polehonki | ........... | B60R 16/0238 |
| | | | | 439/620.27 |
| 8,027,168 B2* | 9/2011 | Senk | ................... | B60R 16/0238 |
| | | | | 174/387 |
| 8,876,537 B2* | 11/2014 | Katsuse | ............... | H01R 13/506 |
| | | | | 439/701 |
| 8,961,197 B2* | 2/2015 | Ferran Palau | ......... | H01R 33/06 |
| | | | | 439/76.2 |
| 9,017,082 B2* | 4/2015 | Makino | .................. | H02G 3/088 |
| | | | | 439/76.2 |

\* cited by examiner

SUPPORT OF AN ELECTRONIC UNIT, ELECTRICAL DEVICE COMPRISING SAME AND ELECTRIC MACHINE COMPRISING THE SAID ELECTRICAL DEVICE

BACKGROUND

The subject of the invention is a support of an electronic unit, notably an electronic board, an electrical device comprising the said support, and an electric machine comprising the said electrical device.

Usually, an electrical device intended to be integrated into an electric machine, such as a voltage converter, comprises electronic units which require efficient insulation to dust, to liquids, to gases or else to moisture. Accordingly, insulation with the aid of a deposition of insulating material can be carried out.

However, in general, insulation of such an electrical device requires a significant quantity of insulating material so as to guarantee efficient insulation of the electrical device. Therefore, these electrical devices have high production costs.

SUMMARY

The present invention is aimed at remedying these drawbacks by proposing a support of an electronic unit making it possible to guarantee efficient insulation of the electronic unit and of the electrical connection elements for connecting the said electronic unit with another electronic unit, while reducing the quantity of insulating material required.

For this purpose, the subject of the invention is a support of an electronic unit, notably an electronic board, intended to be integrated into a housing to support a first electronic unit and to allow electrical connection between the first electronic unit and a second electronic unit situated opposite, via at least one electrical connection element, the said support comprising:
  an open cavity intended to receive the first electronic unit;
  a hollow column into which the at least one electrical connection element is intended to be inserted, the hollow column extending from the open cavity and being configured to communicate with the open cavity at a first end of the hollow column; and
  a channel comprising an end communicating with the bottom of the open cavity and another end communicating with a lateral wall of the hollow column.

Advantageously, the channel makes it possible to guarantee efficient insulation inside the hollow column, and in particular at the level of the electrical connection elements. In particular, the channel makes it possible to guarantee the filling of the hollow column, and thus to avoid any risk of short-circuiting at the level of the interconnections of the electronic units. The advantage of the channel is also to allow insulation which is both fast and not very cumbersome.

Furthermore, the hollow column makes it possible to decrease the production costs of an electrical device comprising the support of an electronic unit according to the invention, by virtue of a reduction in the quantity of insulating material required to efficiently insulate the electronic unit and the electrical connection elements.

Moreover, the electronic unit support according to the invention allows efficient insulation, without increasing the size of the electrical device.

The support of an electronic unit according to the invention can also comprise one or more of the following characteristics, considered individually or according to all the possible combinations:
  the channel has a general ramp shape;
  the channel has a helical general shape;
  the support of the first electronic unit is intended to receive an insulating material so that the first electronic unit is embedded in the insulating material;
  the hollow column is intended to be filled with the said insulating material, at least by way of the said channel, the said channel forming a filling element for the hollow column;
  the support of an electronic unit according to the invention, in which the first electronic unit is intended to be connected electrically to a plurality of second electronic units, the support comprising:
    a plurality of hollow columns, each hollow column extending from the open cavity and being configured to communicate with the open cavity at a first end of the hollow column, each hollow column being intended to receive at least one electrical connection element for connecting each of the plurality of second electronic units with the first electronics; and
    a plurality of channels respectively of each hollow column, each channel comprising an end communicating with the bottom of the open cavity and another end communicating respectively with a lateral wall of a hallow column;
  the support of the first electronic unit has a general horseshoe shape;
  the support of en electronic unit according to the invention, forming the support of an electronic control unit, notably an electronic control board, is intended to be integrated into an electric machine housing, to support the electronic control unit and to allow electrical connection between the electronic control unit and an electronic power unit situated opposite, via at least one electrical connection element.

The invention also pertains to en electrical device, notably intended to supply electric machine, comprising:
  at least two electronic units situated opposite one another;
  at least one electrical connection element intended to electrically connect the at least two electronic units; and
  a support of one from among the at least two electronic units according to the invention.

Advantageously, the production costs of such an electrical device are reduced, notably by virtue of a reduction in the quantity of insulating material and of the time required to efficiently insulate the electronic unit and the electrical connection elements.

Notably, the device is intended to be integrated into an electric machine.

Notably, one of the electronic units is en electronic control unit; the other electronic unit is an electronic power unit.

The invention also relates to an electric machine for automotive vehicle, characterized in that it comprises at least one electrical device according to the invention. For example, the electric machine is a starter, a starter-alternator or another electric machine onboard the vehicle.

BRIEF DESCRIPTION OF DRAWINGS

Other characteristics and advantages of the present invention will become apparent on reading the description and the following figures.

It should be noted that these drawings have no other aim than to illustrate the text of the description and do not in any way constitute a limitation of the scope of the invention.

In the various figures, analogous elements are designated by identical references.

DETAILED DESCRIPTION

The electrical device according to the invention is notably intended to supply an electric machine, notably an electric machine for an automotive vehicle, such as a rotating electric machine.

The electrical device comprises at least one first electronic unit, for example an electronic control unit, at least one second electronic unit, for example an electronic power unit, the two electronic units being situated opposite one another, at least one electrical connection element intended to electrically connect the two electronic units, and a support of one from among the two electronic units, for example a support of the electronic control unit.

The electrical device is for example a voltage converter such as illustrated in the figures. Of course, the invention is in no way limited to a voltage converter, but on the contrary the electrical device could be any other electrical device intended to control an electric machine.

Likewise, the first electronic unit will be illustrated subsequently by an electronic control unit, such as an electronic control board and the second electronic unit will be illustrated by an electronic power unit, such as one or more electronic power modules. Of course, the first and second electronic units could be respectively any other electronic component.

Figure 1:
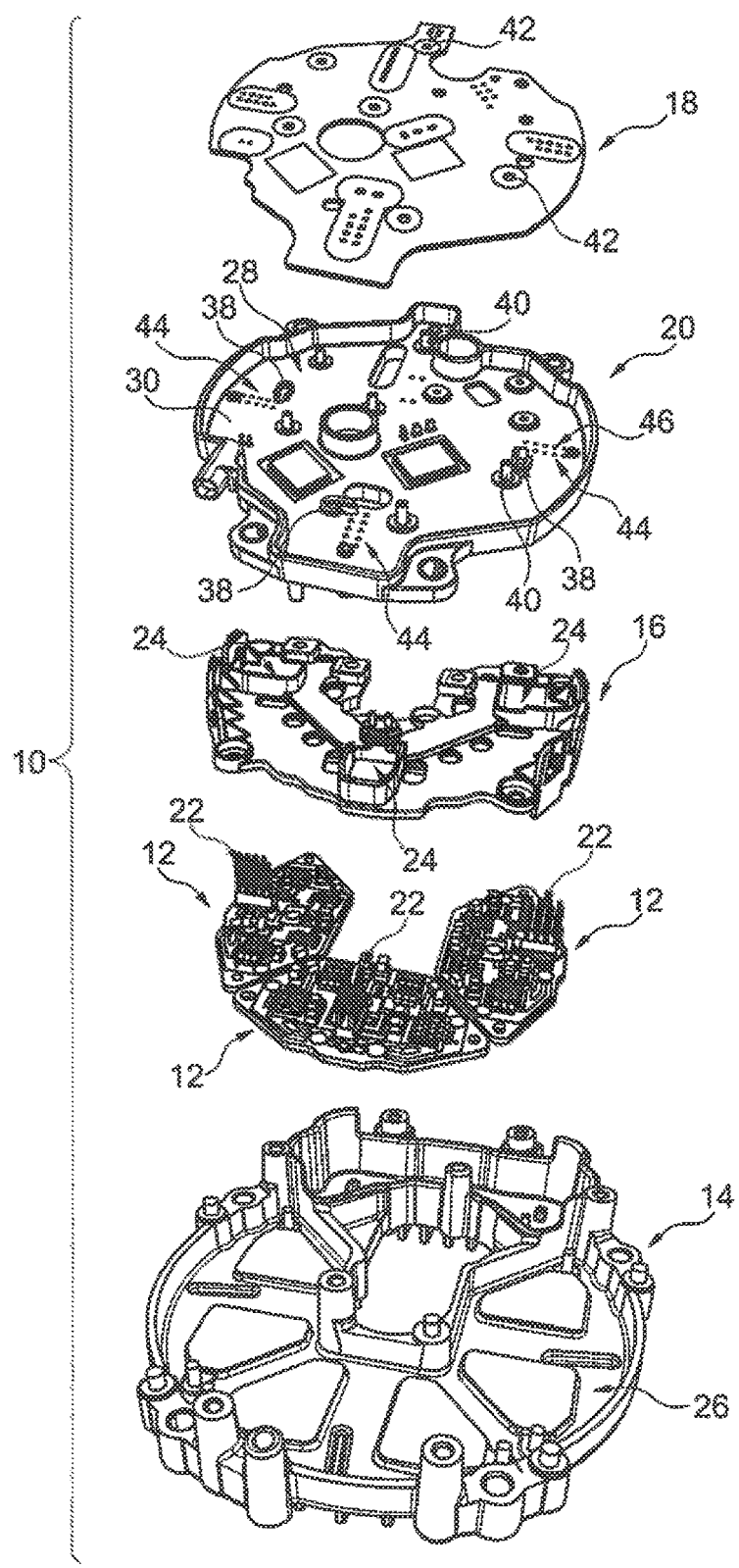
FIG. 1 is an exploded view according to a preferred embodiment of an electrical device according to the invention.

In particular, FIG. 1 represents an exploded view of a voltage converter 10 comprising electronic power modules 12, in this example three in number, a support 14 of the electronic modules, an electrical connector 16, an electronic control board 18, and an electronic board support 20.

Advantageously, the voltage converter 10 is an AC/DC converter. Preferably, the voltage converter 10 is integrated into the casing of the electric machine.

The electronic control board 18 is notably intended to control the electronic power modules 12. In particular, the electronic board 18 is intended to be connected electrically with the electronic power modules 12 via at least one electrical connection element 22.

The electrical connector 16 is arranged between the electronic power modules 12 and the support 20 of the electronic board. The electrical connector 16 is configured to electrically connect the electronic modules 12 to at least one of the electrical elements (phase φ), of the electric machine and/or to at least one of the electrical elements ($B^+$, $B^-$) of an electrical energy source. The electrical elements of the electric machine are, for example, phases φ. The electrical elements of the electrical energy source are for example a positive DC terminal $B^+$, a negative DC terminal $B^-$ or the earth. There is preferably an electronic power module 12 per phase φ. Furthermore, as represented in FIG. 1, the electrical connector 16 comprises orifices 24 designed to permit access of the electrical connection elements 22 of the electronic modules 12 to the electronic control board 18.

The support 14 of the electronic power unit is advantageously a box comprising at least one open cavity 26 having a bottom on which the electronic power modules 12 are mounted. Advantageously, the box allows thermal and electrical conduction, notably for earth pickup and thermal diffusion. The open cavity 26 is intended to be filled with an insulating material A, notably visible in FIG. 3, so that the electronic power modules 12 are embedded in the insulating material A. In particular, this configuration allows efficient insulation of the electronic modules 12. Advantageously, the power module support 14 is a heat dissipator, also called a thermal dissipator. The power modules 12 are fixed to the thermal dissipator so as to allow thermal transfer between the power modules 12 and a coding circuit (not represented), so as to dissipate the heat generated by the electronic modules 12. Furthermore, the open cavity 26 for receiving the electronic modules can comprise positioning elements (not represented) intended to position the electronic modules 12 on the support 14 in a predetermined position. These positioning elements make it possible to facilitate and guarantee correct and fast positioning of the electronic modules 12 on the support 14 with a view to their electrical connection with the electronic board 18.

The support 20 of the electronic control board is arranged between the electronic power modules 12 and the electronic control board 16. The support 20 of the electronic control board is preferably made of insulating substance, for example moulded from plastic.

The support 20 of the electronic board is intended to be integrated into a housing to support the electronic board 18. The support 20 of the electronic board is intended to allow electrical connection between the electronic control board 18 and the electronic power modules 12 situated opposite, via at least one electrical connection element 22.

For this purpose, the support 20 comprises an open cavity intended to receive the electronic control board 18, and in particular, an open cavity 28 having a bottom 30 on which the electronic board 18 is intended to be received.

Preferably, the support 20 of the electronic board has a general horseshoe shape.

Furthermore, the bottom 30 of the open cavity 28 preferably comprises positioning elements 40 intended to position the electronic board 18 on the support 20 in a predetermined position. Stated otherwise, the positioning elements 40 disposed on the support 20 of the electronic board are intended to cooperate with complementary positioning elements 42 of the electronic board 18. For example, in FIG. 1, six positioning elements 40 are represented, each comprising a lug protruding from the bottom 30 of the open cavity 28, in a manner perpendicular to the bottom 30. The positioning elements 40 can be of cylindrical shape as represented in FIG. 1. The six complementary positioning elements 42 of the electronic board are positioning orifices preferably exhibiting a cross-section whose shape and dimensions are complementary to the shape and dimensions of the positioning elements 40. For example, as illustrated in FIG. 1, the complementary positioning elements 42 exhibit a circular cross-section. These positioning elements 40 make it possible to position the electronic board 18 correctly and rapidly on the support 20, and thus to allow efficient electrical connection of the electronic board 18 with the electronic power modules 12.

Figure 2:
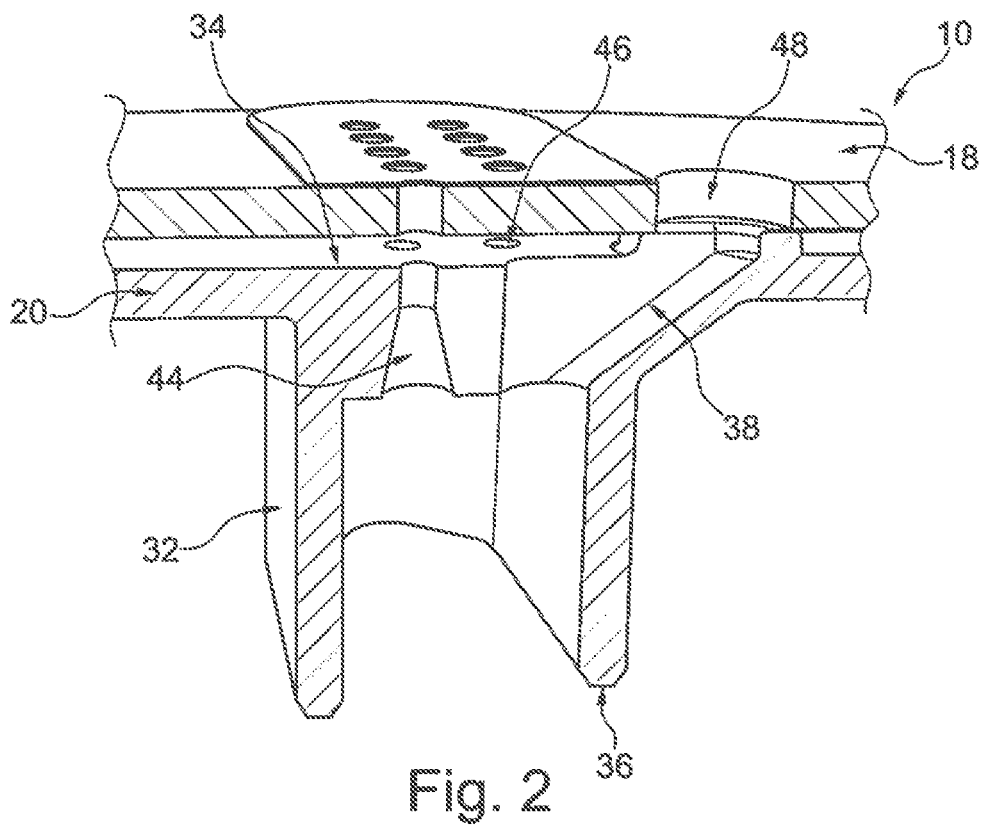
FIG. 2 represents a sectional view of an electronic board and of a support of an electronic unit according to an embodiment of the invention.

As illustrated in FIG. 2, the support 20 also comprises at least one hollow column 32 into which the at least one electrical connection element 22 for connecting the electronic board 18 with the electronic modules 12 is intended to be inserted.

The hollow column 32 extends from the open cavity 28 and is configured to communicate with the open cavity 28 at a first end 34 of the hollow column 32.

In particular, in FIG. 1, the electronic control board 18 is intended to be connected electrically to a plurality of electronic power modules 12, the support 20 of the electronic board 18 comprising three hollow columns, each hollow column being intended to receive the electrical connection elements 22 for connecting each electronic module 12 with the electronic control board 18.

Figure 3:
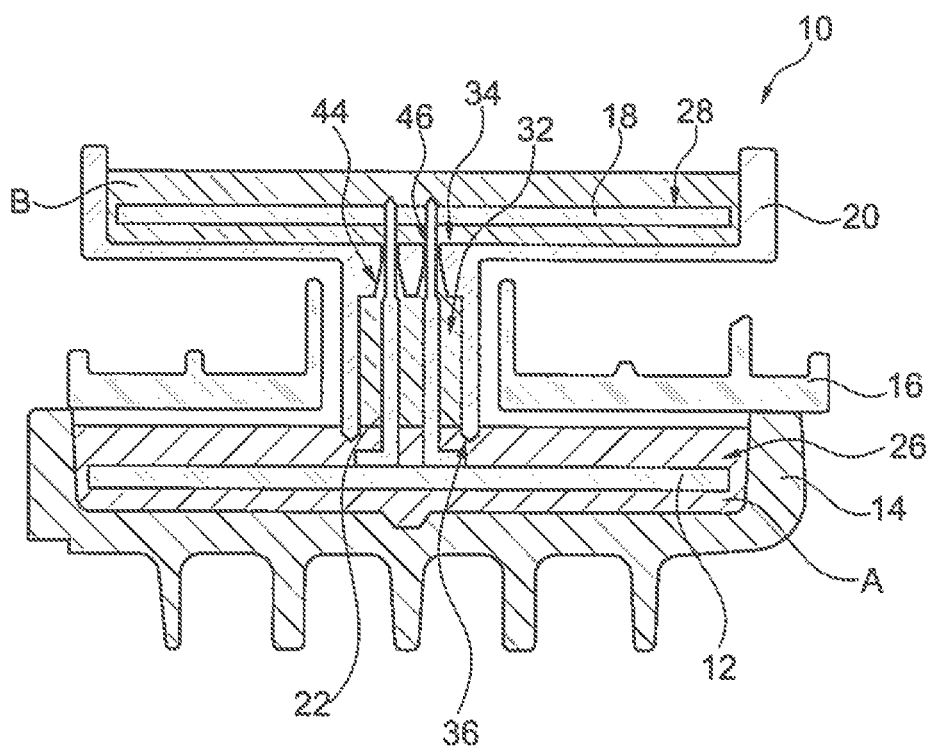
FIG. 3 represents a sectional view of an electrical device according to an embodiment of the invention.

The support 20 of the electronic board is intended to receive an insulating material B, notably visible in FIG. 3, so that the electronic board 18 is embedded in the insulating material B. In particular, the insulating material B is intended to fill the free interior space of the open cavity 28 around the components of the electronic board 18, the electronic control board 18 thus being insulated in en efficient manner.

For example, the insulating material B can be a resin, such as an epoxy resin, or an insulating gel, such as a silicone gel.

Advantageously, the electronic control board support 20 can comprise a channel 38, also called a filling element for the hollow column 32. The channel 38 can have a general ramp shape, and preferentially a helical general shape. An end of the channel 38 communicates with the bottom 30 of the open cavity 28 and another end of the channel 38 communicates with a lateral wall of the hollow column 32. The channel 38 thus allows fast and fairly unencumbered access to the interior of the hollow column 32.

The hollow column 32 is intended to be filled with the insulating material, notably by way of the channel 38, the said channel 38 forming a filling element for the hollow column 32.

The channel 38 ensures correct filling of the hollow column with the insulating material, thus making it possible to guarantee efficient electrical insulation of the electrical connection elements 22 of the electrical device 10.

The electronic board support 20 has been described as comprising a channel 38 associated with a hollow column 32. Of course, the support according to the invention could comprise several channels for each hollow column.

The support 20 can comprise a plurality of channels 38 such as are described above, each channel 38 being associated with a hollow column 32. In particular, in FIG. 1, the support 20 of the electronic board comprises three channels 38 respectively of each hollow column, each channel 38 comprising an end communicating with the bottom 30 of the open cavity 28 and another end communicating respectively with a lateral wall of a hollow column.

Furthermore, as illustrated in FIG. 2, the electronic control board 18 can advantageously comprise an orifice 48 arranged opposite the end of the channel 38 communicating with the bottom 30 of the open cavity 28. The orifice 48 of the electronic board 18 allows the filling of the hollow column 32 with insulating material B by way of the channel 38.

Preferably, as illustrated in FIG. 3, a second end 36 of the hollow column 32 is in contact with the insulating material A in which the electronic module 12 is embedded. This configuration makes it possible to guarantee the filling of the hollow column 32 with insulating material B, and thus to ensure efficient insulation to dust, to liquids, to gases or else to moisture of the electrical connection elements 22. The insulating material thus makes it possible to eliminate any risk of possible short-circuit at the level of the interconnection of the electronic board 18 with the electronic power modules 12.

In particular, the electronic control board 18 and the electronic power modules 12 can be insulated with identical or different insulating materials A, B, preferably an identical insulating material, notably an insulating gel.

The interface between the insulating material A of the electronic power module 12 and the insulating material B of the electronic control board 18 is notably situated inside the hollow column 32, in proximity to the second end 36 of the hollow column 32.

Furthermore, the space lying between the electronic board 18 and the power module 12 and surrounding the hollow column 32 is devoid of substance, notably of insulating material. The space free of substance, notably of insulating material, has, inter alia, the effect of leaving a space free for air circulation, thus allowing cooling by convection. Moreover, this configuration makes it possible to decrease the production costs of the electrical device 10, by virtue notably of a saving in insulating material.

Moreover, the bottom 30 of the open cavity 28 advantageously comprises guidance elements 44 for guiding the at least one electrical connection element 22 arranged at the first end 34 of the hollow column 32 and intended to guide the at least one electrical connection element 22 towards the electronic board 18. For example, in FIG. 1, the bottom 30 of the open cavity 28 comprises three groups of guidance elements 44. The guidance elements 44 comprise guidance orifices 46, advantageously a guidance orifice 46 per electrical connection element 22. The guidance orifices 46 make it possible to recentre the electrical connection elements 22 with a view to the electrical connection of the electronic module 12 with the electronic board 18 and thus to correctly connect the electronic module 12 with the electronic board 18. Preferably, in order to allow better recentring of the electrical connection elements 22, the cross-section of the guidance orifices 46 facing the electronic module 12 is larger than the cross-section of the guidance orifices 46 facing the electronic board 18. For example, in FIG. 2, the guidance elements 44 exhibit a circular cross-section and comprise a frustoconical portion followed by a cylindrical portion.

The electrical device intended to be integrated into en electric machine has been described within the framework of a voltage converter intended to be integrated into en electric machine for automotive vehicle. Of course, the invention is in no way limited to the embodiment described and illustrated, which has been given merely by way of example. On the contrary, other applications of the electrical device in accordance with the invention are also possible without departing from the scope of the invention.

The invention claimed is:

1. A support of an electronic unit, configured to be integrated into a housing to support a first electronic unit and to allow electrical connection between the first electronic unit and a second electronic unit situated opposite, via at least one electrical connection element, the support comprising:

an open cavity for receiving the first electronic unit;

a hollow column into which the at least one electrical connection element is inserted, the hollow column extending from the open cavity and being configured to communicate with the open cavity at a first end of the hollow column; and a channel comprising an end communicating with a bottom of the open cavity and another end communicating with a lateral wall of the hollow column, wherein the support of the electronic unit receives an insulating material that embeds the first electronic unit, and wherein the hollow column is filled with the insulating material by way of the channel, the channel forming a filling element for the hollow column.

2. The support of an electronic unit according to claim 1, in which the channel has a ramp shape.

3. The support of an electronic unit according to claim 1, in which the channel has a helical general shape.

4. The support of an electronic unit according to claim 1, the first electronic unit being connected electrically to a plurality of second electronic units, the support comprising:

a plurality of hollow columns, each hollow column extending from the open cavity and being configured to communicate with the open cavity at the first end of the hollow column, each hollow column being intended to receive the at least one electrical connection element for connecting each of the plurality of the plurality of second electronic units with the first electronic unit; and a plurality of channels respectively of each hollow column, each channel comprising an end communicating with the bottom of the open cavity and another end communicating respectively with a lateral wall of each hollow column.

5. The support of an electronic unit according to claim 1, in which the support of the first electronic unit has a general horseshoe shape.

6. The support of an electronic unit according to claim 1, forming the support of an electronic control unit, integrated into an electric machine housing, to support the electronic control unit and to allow electrical connection between the electronic control unit and an electronic power unit situated opposite, via the at least one electrical connection element.

7. The support of the electronic unit according to claim 1, wherein the electronic unit is an electronic board.

8. An electrical device for supplying an electric machine, comprising:

the at least one electrical connection element intended to electrically connect the at least two electronic units; and the support of one from among the at least two electronic units according to claim 1, wherein the at least two electronic units are situated opposite one another.

9. An electric machine for automotive vehicle, comprising at least one electrical device according to claim 8.

* * * * *